(12) United States Patent
Timoney et al.

(10) Patent No.: US 9,903,707 B2
(45) Date of Patent: Feb. 27, 2018

(54) THREE-DIMENSIONAL SCATTEROMETRY FOR MEASURING DIELECTRIC THICKNESS

(71) Applicant: GLOBALFOUNDRIES Inc., Grand Cayman (KY)

(72) Inventors: Padraig Timoney, Malta, NY (US); Alok Vaid, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 130 days.

(21) Appl. No.: 14/857,914

(22) Filed: Sep. 18, 2015

(65) Prior Publication Data
US 2017/0082423 A1     Mar. 23, 2017

(51) Int. Cl.
*H01L 21/02* (2006.01)
*G01B 11/06* (2006.01)
*H01L 21/66* (2006.01)

(52) U.S. Cl.
CPC .............. *G01B 11/06* (2013.01); *H01L 22/12* (2013.01); *H01L 22/26* (2013.01)

(58) Field of Classification Search
None
See application file for complete search history.

(56) References Cited

U.S. PATENT DOCUMENTS

| 9,076,688 B1 | 7/2015 | Lutz et al. |
| 2017/0082423 A1* | 3/2017 | Timoney ................ G01B 11/06 |

* cited by examiner

*Primary Examiner* — Jack Chen
(74) *Attorney, Agent, or Firm* — Ditthavong & Steiner, P.C.

(57) ABSTRACT

Methodologies and an apparatus for enabling three-dimensional scatterometry to be used to measure a thickness of dielectric layers in semiconductor devices are provided. Embodiments include initiating optical critical dimension (OCD) scatterometry on a three-dimensional test structure formed on a wafer, the three-dimensional test structure comprising patterned copper (Cu) trenches with an ultra-low k (ULK) dielectric film formed over the patterned Cu trenches; and obtaining, by a processor, a thickness of the ULK dielectric film based on results of the OCD scatterometry.

8 Claims, 3 Drawing Sheets

THREE-DIMENSIONAL SCATTEROMETRY FOR MEASURING DIELECTRIC THICKNESS

TECHNICAL FIELD

The present disclosure relates to a method and an apparatus for determining thicknesses of dielectric layers in fabricated semiconductor devices. In particular, the present disclosure relates to three-dimensional scatterometry for semiconductor devices in the 20 nanometer (nm) technology node and beyond.

BACKGROUND

Three dimensional scatterometry uses a diffraction based reflectometer to measure embedded details and critical profile parameters of complex three dimensional semiconductor structures. Reliable measurements of such details make three dimensional scatterometry an important instrument for both device development and process control. Three dimensional scatterometry combines non-contact optical technology with advanced modeling software to provide accurate measurements resulting in a three dimensional metrology system.

Spectroscopic ellipsometry and scatterometry are used to measure low k dielectric film thickness formed above a 50×50 micrometers (μm) copper (Cu) pad (also referred to as a one-dimensional metrology target) in a back end of line (BEOL) interconnect. However, Cu pad thinning due to pattern dependent Cu chemical mechanical polishing (CMP) causes inconsistent light transmissibility resulting in unstable ultra-low k (ULK) dielectric thickness measurement. For advanced technology nodes, (e.g., 20 nm, 14 nm and beyond), based upon process requirements, the design of Cu trench height has been drastically reduced, often less than 60 nm).

Measurement of remaining Cu height on 20 nm technology node wafers reveals that Cu height at conventional one-dimensional film thickness metrology structures can vary by up to 80% within wafer. This observed within wafer variation in Cu height of the conventional one-dimensional film thickness metrology structures demonstrates the probability of measurement noise due to penetration of light through the Cu and the difficulty in utilizing a uniform ellipsometry model for the Cu for both center and edge measurement locations.

A need therefore exists for methodology and an apparatus for enabling measurement of a ULK dielectric film stack above a three-dimensional Cu trench grating, with improved measurement repeatability and without sensitivity to underlying Cu trench height.

SUMMARY

One aspect of the present disclosure is a method and apparatus to accurately measure a ULK dielectric film stack above a three-dimensional Cu trench grating. Another aspect includes the capability of the measurement to function successfully independent of the height of the Cu trenches below the ULK film of interest.

Another aspect of the present disclosure is a method and apparatus to measure in-die devices areas and e-test structures rather than requiring the design of a unique non-design rule compliant metrology measurement structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: initiating optical critical dimension (OCD) scatterometry on a three-dimensional test structure formed on a wafer, the three-dimensional test structure including patterned copper (Cu) trenches with an ultra-low k (ULK) dielectric film formed over the patterned Cu trenches; and obtaining, by a processor, a thickness of the ULK dielectric film based on results of the OCD scatterometry.

Aspects of the present disclosure include a method, wherein the OCD scatterometry is a three-dimensional OCD scatterometry, and the thickness of the ULK dielectric film is obtained by way of light reflectivity. Some aspects may include a first Cu trench running in a first direction in the three-dimensional test structure, and a second Cu trench, above the first Cu trench, running in a second direction in the three-dimensional test structure. Other aspects include the first direction being perpendicular to the second direction, or the first direction being parallel to the second direction. Additional aspects include the Cu trenches decreasing in height near an edge of the wafer when compared to a center of the wafer. Further aspects include automatically adjusting deposition time of ULK dielectric film formed on the next wafer, based on the results of the OCD scatterometry on the previously measured wafer.

Another aspect of the present disclosure is an apparatus including a processor; and memory including computer program code for a program, the memory and the computer program code configured to, with the processor, cause the apparatus to perform at least the following: initiate OCD scatterometry on a three-dimensional test structure formed on a wafer, the three-dimensional test structure including patterned copper (Cu) trenches with a ULK dielectric film formed over the patterned Cu trenches; and obtain, by the processor, a thickness of the ULK dielectric film based on results of the OCD scatterometry.

Aspects include the OCD scatterometry being a three-dimensional OCD scatterometry. Some aspects include the patterned Cu trenches including: first Cu trenches running in a first direction in the three-dimensional test structure, and second Cu trenches, above the first Cu trenches, running in a second direction in the three-dimensional test structure. Aspects include the first direction being perpendicular to the second direction, or the first direction being parallel to the second direction. Some aspects include the capability of the measurement to function successfully independent of the height of the Cu trenches below the ULK film of interest. Further aspects include automatically adjusting deposition time of ULK dielectric film formed on the next wafer, based on the results of the OCD scatterometry on the previously measured wafer.

Aspects include the thickness of the ULK dielectric film is obtained by way of light reflectivity, and the deposition time of the second ULK dielectric film is increased based on the results of the three-dimensional OCD scatterometry on the first wafer. Some aspects include the deposition time of the second ULK dielectric film is decreased based on the results of the three-dimensional OCD scatterometry on the first wafer. Other aspects include the patterned Cu trenches including first Cu trenches running in a first direction in the three-dimensional test structure, and second Cu trenches, above the first Cu trenches, running in a second direction in the three-dimensional test structure, wherein the first direction is perpendicular or parallel to the second direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
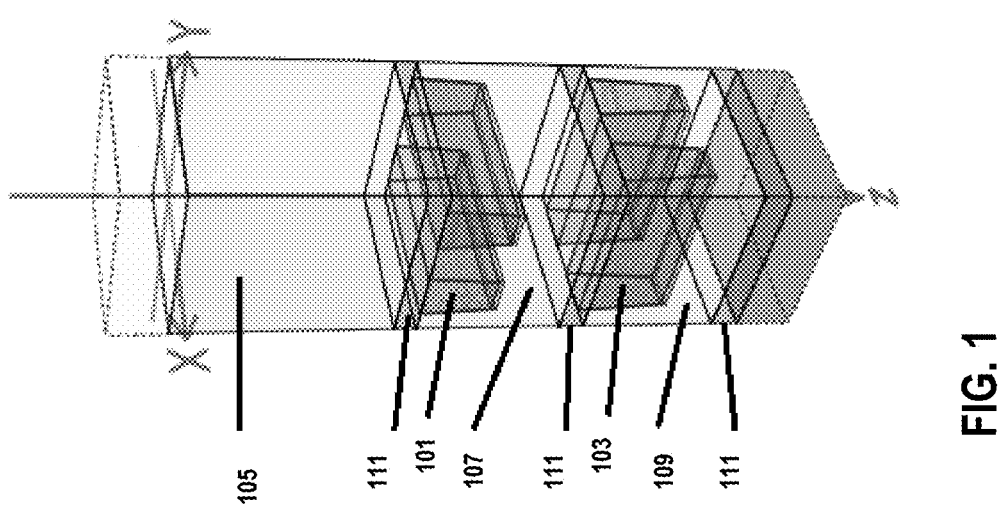
FIG. 1 illustrates a OCD model schematic of a structure to be measured with three dimensional scatterometry, according to an exemplary embodiment.

FIG. 1 illustrates an OCD model schematic of a three-dimensional structure to be measured with three-dimensional scatterometry. As shown, the test structure includes Cu trenches 101 and 103 running in perpendicular directions below the ULK dielectric layer 105, which is the layer of interest for the three-dimensional scatterometry. The Cu trenches may decrease in height near an edge of the wafer when compared to a center of the wafer.

Bottom regions 107 and 109 of ULK are shown disposed between dielectric cap layers 111 and formed around CU trenches/lines 101 and 103. The dielectric cap layers 111 can includes NBLoK (nitrogen-doped silicon carbide) layers. The structure as shown in FIG. 1 is an example of an OCD model schematic of an operational semiconductor device/product formed on a wafer (not shown), as opposed to a conventional method requiring a test structure intentionally designed for measurement. Further, improved measurement precision is achieved with three-dimensional scatterometry compared to prior one-dimensional scatterometry and spectroscopic ellipsometry.

Figure 2:
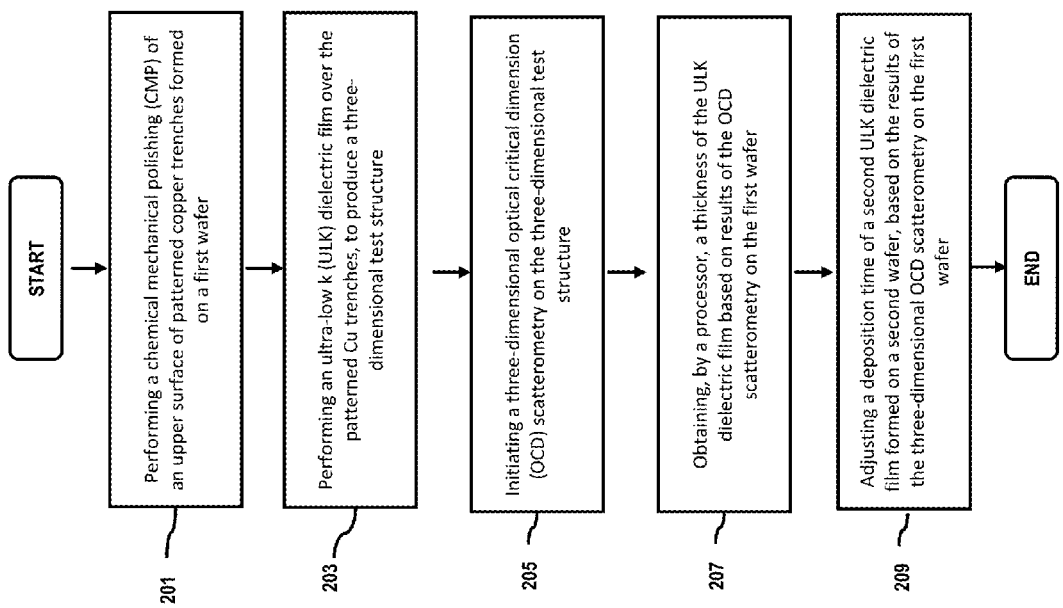
FIG. 2 illustrates a process flow for measuring a structure with three dimensional scatterometry, according to an exemplary embodiment.

FIG. 2 illustrates a process flow for measuring a structure with three dimensional scatterometry. In step 201, chemical mechanical polishing (CMP) is performed on the upper surface of patterned copper trenches formed on a first wafer. Excess copper formed above the patterned trenches is removed with the CMP. In step 203, an ultra-low k (ULK) dielectric film is deposited on the patterned Cu trenches, to produce a three-dimensional test structure. In step 205, a three-dimensional optical critical dimension (OCD) scatterometry is initiated on the three-dimensional test structure. In step 207, a thickness of the ULK dielectric film based on results of the OCD scatterometry on the first wafer is obtained by way of a processor. The process receives a post processing signal which then is used by the processor to calculate a thickness of the ULK dielectric film. In step 209, a deposition time of ULK dielectric film to be formed on the next wafer is adjusted, based on the results of the three-dimensional OCD scatterometry on the first wafer.

The process in FIG. 2 demonstrates that both feedback and feedforward control can be provided. The thickness of the ULK dielectric can be accurately measured, and if the thickness of the ULK dielectric does not comply with design specifications (i.e., too thin or too thick), an adjustment to a deposition time for a subsequent ULK dielectric film on a second wafer can be performed in order to obtain the desired thickness of the ULK dielectric film. The three-dimensional scatterometry measures the thickness of the ULK dielectric layer by way of light reflectivity as a function of wavelength (nm) to obtain data for modeling analysis by a computer system.

In certain embodiments, the application of existing known scatterometry modeling, such as Rigorous Coupled Wave Analysis (RCWA) can be used. RCWA uses a specifically engineered program to reduce computational time and size of a scatterometry library.

The present invention provides consistent, three-dimensional measurement precision regardless of any factors that could impact one-dimensional measurement precision. Typically, a 1% precision with respect to nominal ULK thickness value is required for reliable metrology. However, in certain embodiments, less than a 0.2% measurement precision with respect to the nominal ULK thickness value is obtained. As a comparison, the measurement precision is greater than 2% of the nominal ULK thickness value is obtained with a one-dimensional measurement.

Figure 3:
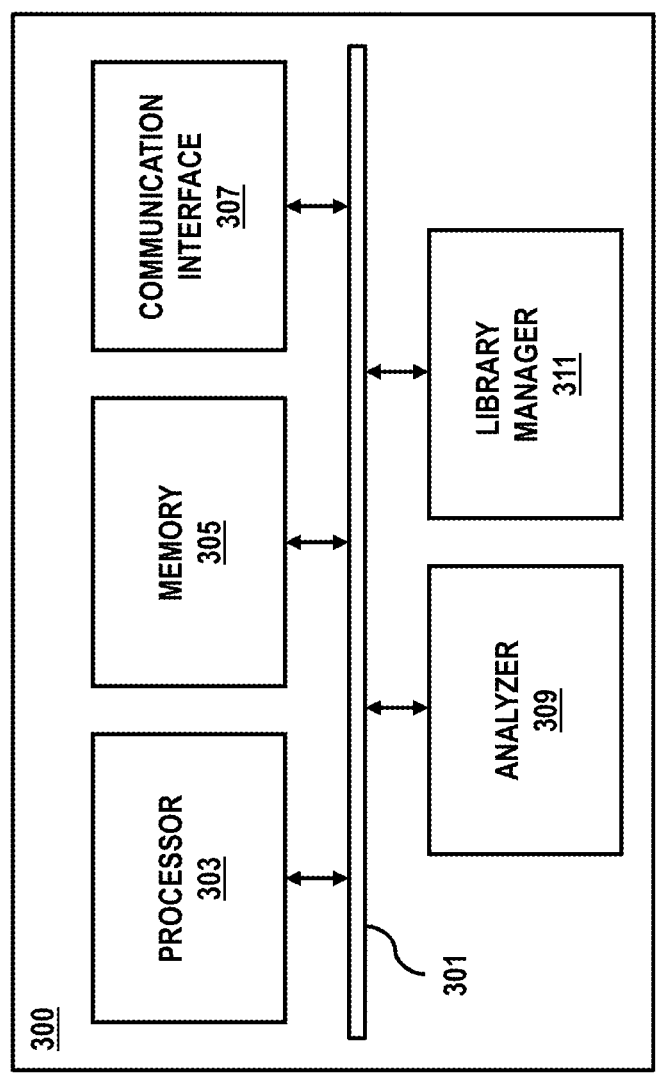
FIG. 3 schematically illustrates a computer system for measuring a thickness of a ULK dielectric in fabricated semiconductor devices, in accordance with an exemplary embodiment.

FIG. 3 schematically illustrates a computer system 300 upon which an exemplary embodiment of the invention may be implemented. Computer system 300 may, for instance, be programmed (e.g., via computer program code or instructions) to initiate OCD three-dimensional scatterometry on a structure (FIG. 1), determine a scattering spectra corresponding to a physical characteristic, including ULK dielectric thickness, and associate the scattering spectra with a physical characteristic in a library for estimating a physical dimension of a fabricated structure, for instance, as illustrated in FIG. 1, as described herein and may include a communication mechanism such as a bus 301 for passing information between other internal and external components of the computer system 300. Moreover, computer system 300 may include a processor (or multiple processors) 303 for performing a set of operations on information as specified by computer program code related to measuring scattering spectra and estimating physical dimensions including ULK dielectric thickness. Computer system 300 may also include memory 305 coupled to bus 301. The memory 305 may, for instance, include dynamic storage, static storage, or a combination thereof for storing calculated scattering spectra and associated physical dimensions, including the thickness of the ULK dielectric.

Processor 303 may perform a three-dimensional scatterometry measurement on a structure and may thereafter monitor, calculate, record, etc., scatterometry spectra for each measurement. By way of example, based on computer program code in memory 305, processor 303 may interact with communication interface 307 and may then work with analyzer 309 to monitor and record scatterometry spectra for a structure. Library Manager 311 may optionally compare the measured scatterometry spectra with previously calculated spectra in a library and associate the measured scatterometry spectra with an estimated (critical) dimension in a database, for instance, matching calculated scatterometry spectra in the library.

It is noted that, in various aspects, some or all of the techniques described herein are performed by computer system 300 in response to processor 303 executing one or more sequences of one or more processor instructions contained in memory 305. Such instructions, also called computer instructions, software and program code, may be read into memory 305 from another computer-readable medium such as a storage device or a network link. Execution of the sequences of instructions contained in memory 305 causes processor 303 to perform one or more of the method steps described herein. In alternative embodiments, hardware, such as application-specific integrated circuits (ASICs), may be used in place of or in combination with software to implement the invention. Thus, embodiments of the invention are not limited to any specific combination of hardware and software, unless otherwise explicitly stated herein.

The embodiments of the present disclosure can achieve several technical effects including measuring thicknesses of ULK dielectric layers in fabricated semiconductor devices. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   initiating optical critical dimension (OCD) scatterometry on a three-dimensional test structure formed on a wafer, the three-dimensional test structure comprising patterned copper (Cu) trenches with an ultra-low k (ULK) dielectric film formed over the patterned Cu trenches; and
   obtaining, by a processor, a thickness of the ULK dielectric film based on results of the OCD scatterometry.

2. The method according to claim 1, wherein:
   the OCD scatterometry is a three-dimensional OCD scatterometry, and
   the thickness of the ULK dielectric film is obtained by way of light reflectivity.

3. The method according to claim 1, wherein the patterned Cu trenches comprise:
   first Cu trenches running in a first direction in the three-dimensional test structure, and
   second Cu trenches, above the first Cu trenches, running in a second direction in the three-dimensional test structure.

4. The method according to claim 3, wherein the first direction is perpendicular to the second direction.

5. The method according to claim 3, wherein first direction is parallel to the second direction.

6. The method according to claim 1, wherein the Cu trenches decrease in height near an edge of the wafer when compared to a center of the wafer according to normal process variation.

7. The method according to claim 1, further comprising:
   based on the results of the OCD scatterometry, automatically adjusting deposition time of a ULK dielectric film formed on a subsequent wafer, based on the results of the OCD scatterometry on the previously measured wafer.

8. The method according to claim 1, further comprising:
   prior to measuring the thickness of the ULK dielectric film, forming the ULK dielectric film over the Cu trenches.

* * * * *